United States Patent
McHugh et al.

(10) Patent No.: US 7,390,382 B2
(45) Date of Patent: Jun. 24, 2008

(54) REACTORS HAVING MULTIPLE ELECTRODES AND/OR ENCLOSED RECIPROCATING PADDLES, AND ASSOCIATED METHODS

(75) Inventors: Paul R. McHugh, Kalispell, MT (US); Gregory J. Wilson, Kalispell, MT (US); Daniel J. Woodruff, Kalispell, MT (US); Nolan Zimmerman, Kalispell, MT (US); James J. Erickson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 397 days.

(21) Appl. No.: 10/734,100

(22) Filed: Dec. 11, 2003

(65) Prior Publication Data
US 2005/0000817 A1 Jan. 6, 2005

Related U.S. Application Data

(60) Provisional application No. 60/484,603, filed on Jul. 1, 2003, provisional application No. 60/484,604, filed on Jul. 1, 2003.

(51) Int. Cl.
*C25F 7/00* (2006.01)
*C25D 17/02* (2006.01)
*C25D 17/00* (2006.01)
*C25D 7/12* (2006.01)
*C25F 3/30* (2006.01)

(52) U.S. Cl. .............. 204/230.3; 204/272; 204/273
(58) Field of Classification Search ............... None
See application file for complete search history.

(56) References Cited

U.S. PATENT DOCUMENTS 3,652,442 A 3/1972 Powers et al.

(Continued)

FOREIGN PATENT DOCUMENTS

EP 0 343 502 A2 11/1989

(Continued)

OTHER PUBLICATIONS

Wu, Z.L. et al., "Methods for Characterization of Mass Transfer Boundary layer in an industrial Semiconductor Wafer Plating Cell," Abs. 165, 205th Meeting, © The Electrochemical Society, Inc., 2004 (1 Page).

(Continued)

*Primary Examiner*—Harry D Wilkins, III
(74) *Attorney, Agent, or Firm*—Perkins Coie LLP

(57) ABSTRACT

Reactors having multiple electrodes and/or enclosed reciprocating paddles are disclosed. The reactor can include multiple electrodes spaced apart from a process location to provide virtual electrodes proximate to the process location for transferring material to or from the workpiece. A magnet may be positioned proximate to the process plane to orient magnetically sensitive material deposited on the workpiece. The electrodes may be removable from the reactor without passing them through the magnet to reduce interference between the electrodes and the magnet. The workpiece may be carried by a rotatable workpiece support to orient the workpiece for processing. At least one of the electrodes can operate as a current thief to reduce terminal effects at the periphery of the workpiece. An electric field control element positioned between the electrodes and the workpiece circumferentially varies the effect of the thieving electrode current to account for effects created by elongated paddles as they oscillate proximate to the workpiece.

22 Claims, 6 Drawing Sheets

U.S. PATENT DOCUMENTS

| | | | |
|---|---|---|---|
| 4,428,814 A | 1/1984 | Chen | |
| 4,466,864 A * | 8/1984 | Bacon et al. | 205/105 |
| 4,648,774 A | 3/1987 | Dorumsgaard et al. | |
| 4,749,601 A | 6/1988 | Hillinger | |
| 4,868,575 A | 9/1989 | Mok et al. | |
| 4,937,998 A | 7/1990 | Goldberg | |
| 5,000,827 A | 3/1991 | Schuster | |
| 5,222,310 A | 6/1993 | Thompson et al. | |
| 5,230,743 A | 7/1993 | Thompson et al. | |
| 5,284,554 A | 2/1994 | Datta et al. | |
| 5,312,532 A | 5/1994 | Andricacos et al. | |
| 5,344,491 A | 9/1994 | Katou | |
| 5,344,539 A | 9/1994 | Shinogi et al. | |
| 5,421,987 A | 6/1995 | Tzanavaras et al. | |
| 5,431,421 A | 7/1995 | Thompson et al. | |
| 5,476,577 A | 12/1995 | May et al. | |
| 5,486,282 A | 1/1996 | Datta et al. | |
| 5,516,412 A | 5/1996 | Andricacos et al. | |
| 5,531,874 A | 7/1996 | Brophy | |
| 5,536,388 A | 7/1996 | Dinan et al. | |
| 5,543,032 A | 8/1996 | Datta et al. | |
| 5,567,300 A | 10/1996 | Datta et al. | |
| 5,614,076 A | 3/1997 | Brophy | |
| 5,683,564 A | 11/1997 | Reynolds | |
| 5,762,751 A | 6/1998 | Bleck | |
| 5,865,984 A | 2/1999 | Corbin, Jr. et al. | |
| 5,925,226 A | 7/1999 | Hurwitt et al. | |
| 6,001,235 A | 12/1999 | Arken et al. | |
| 6,004,440 A | 12/1999 | Hanson | |
| 6,024,856 A | 2/2000 | Haydu et al. | |
| 6,027,631 A * | 2/2000 | Broadbent | 205/137 |
| 6,037,790 A | 3/2000 | Dinan | |
| 6,042,712 A | 3/2000 | Mathieu | |
| 6,048,154 A | 4/2000 | Wylman | |
| 6,082,948 A | 7/2000 | Fishkin et al. | |
| 6,103,096 A | 8/2000 | Datta et al. | |
| 6,132,586 A | 10/2000 | Adams et al. | |
| 6,136,163 A | 10/2000 | Cheung et al. | |
| 6,139,703 A | 10/2000 | Hanson | |
| 6,156,167 A * | 12/2000 | Patton et al. | 204/270 |
| 6,168,695 B1 | 1/2001 | Woodruff | |
| 6,181,057 B1 | 1/2001 | Inoue et al. | |
| 6,197,182 B1 | 3/2001 | Kaufman et al. | |
| 6,214,193 B1 | 4/2001 | Reid | |
| 6,228,231 B1 | 5/2001 | Uzoh | |
| 6,231,743 B1 | 5/2001 | Etherington | |
| 6,251,250 B1 | 6/2001 | Keigler | |
| 6,322,674 B1 | 11/2001 | Berner | |
| 6,328,872 B1 | 12/2001 | Talieh | |
| 6,379,511 B1 | 4/2002 | Fatula et al. | |
| 6,454,918 B1 | 9/2002 | Sakaki | |
| 6,482,300 B2 | 11/2002 | Sakaki | |
| 6,547,937 B1 | 4/2003 | Oberlitner et al. | |
| 6,635,157 B2 | 10/2003 | Dordi et al. | |
| 6,660,137 B2 | 12/2003 | Wilson et al. | |
| 6,672,820 B1 | 1/2004 | Hanson | |
| 6,773,559 B2 | 8/2004 | Woodruff et al. | |
| 6,875,333 B2 * | 4/2005 | Sakaki | 205/148 |
| 6,955,747 B2 * | 10/2005 | Browne et al. | 204/273 |
| 2001/0032788 A1 | 10/2001 | Woodruff et al. | |
| 2001/0052465 A1 | 12/2001 | Dordi et al. | |
| 2002/0000380 A1 | 1/2002 | Graham et al. | |
| 2002/0088708 A1 | 7/2002 | Sakaki | |
| 2003/0038035 A1 | 2/2003 | Wilson et al. | |
| 2003/0221953 A1 | 12/2003 | Oberlitner | |
| 2004/0007467 A1 | 1/2004 | McHugh et al. | |
| 2004/0134774 A1 | 7/2004 | Woodruff et al. | |
| 2004/0245094 A1 | 12/2004 | McHugh et al. | |
| 2005/0000817 A1 | 1/2005 | McHugh et al. | |
| 2005/0006241 A1 | 1/2005 | McHugh et al. | |
| 2005/0034977 A1 | 2/2005 | Hanson et al. | |
| 2005/0089645 A1 | 4/2005 | Keigler et al. | |
| 2005/0145499 A1 | 7/2005 | Kovarsky et al. | |
| 2005/0167275 A1 | 8/2005 | Keigler et al. | |

FOREIGN PATENT DOCUMENTS

| | | |
|---|---|---|
| EP | 0 726 698 A2 | 8/1996 |
| JP | 62-297494 | 12/1987 |
| JP | 62-297495 | 12/1987 |
| JP | 1-120827 | 5/1989 |
| JP | 5-175158 | 7/1993 |
| JP | 6-260468 | 9/1994 |
| JP | 7-211724 | 8/1995 |
| JP | 7-284738 | 10/1995 |
| JP | 09-089067 | 3/1997 |
| JP | 10-172974 | 6/1998 |
| JP | 11-092993 | 4/1999 |
| JP | 2000-17480 | 1/2000 |
| JP | 2001-64795 | 3/2001 |
| WO | WO-99/25004 | 5/1999 |
| WO | WO-01/50505 A3 | 7/2001 |
| WO | WO-2004/110698 A2 | 12/2004 |
| WO | WO-2005/042804 A2 | 5/2005 |

OTHER PUBLICATIONS

Tacken, R.A. et al., "Applications of Magnetoelectrolysis", Journal of Applied Electrochemistry, 1995 (no month), vol. 25, pp. 1-5.

* cited by examiner

REACTORS HAVING MULTIPLE ELECTRODES AND/OR ENCLOSED RECIPROCATING PADDLES, AND ASSOCIATED METHODS

CROSS-REFERENCE TO RELATED APPLICATIONS

The present application claims priority to pending U.S. Provisional Application No. 60/484,603 and pending U.S. Provisional Application No. 60/484,604, both filed Jul. 1, 2003 and both incorporated herein in their entities by reference.

TECHNICAL FIELD

The present invention is directed toward reactors having multiple electrodes and/or enclosed, reciprocating paddles, and associated methods.

BACKGROUND

Microdevices are manufactured by depositing and working several layers of materials on a single substrate to produce a large number of individual devices. For example, layers of photoresist, conductive materials, and dielectric materials are deposited, patterned, developed, etched, planarized, and so forth to form features in and/or on a substrate. The features are arranged to form integrated circuits, micro-fluidic systems, and other structures.

Wet chemical processes are commonly used to form features on microfeature workpieces. Wet chemical processes are generally performed in wet chemical processing tools that have a plurality of individual processing chambers for cleaning, etching, electrochemically depositing materials, or performing combinations of these processes. In some cases, the processing chambers include a vessel configured to electrolytically apply material to the workpiece and/or remove material from the workpiece. The workpiece is partially immersed in a bath that includes an electrolyte in fluid communication with an electrode. When material is to be added to the workpiece, electrical potentials of opposite polarities are applied to the electrode (which functions as an anode) and the workpiece (which functions as a cathode). When material is to be removed from the workpiece, the polarities are reversed so that the electrode operates as a cathode and the workpiece operates as an anode.

During electrolytic processing, a diffusion layer develops at the surface of the workpiece in contact with the electrolytic liquid. The concentration of the material applied to or removed from the workpiece varies over the thickness of the diffusion layer. In many cases, it is desirable to reduce the thickness of the diffusion layer so as to allow an increase in the speed with which material is added to or removed from the workpiece. In other cases, it is desirable to otherwise control the material transfer at the surface of the workpiece, for example to control the composition of an alloy deposited on the surface, or to more uniformly deposit materials in surface recesses having different aspect ratios.

One approach to reducing the diffusion layer thickness is to increase the flow velocity of the electrolyte at the surface of the workpiece. For example, some vessels include paddles that translate or rotate immediately adjacent to the workpiece to create a high speed, agitated flow at the surface of the workpiece. In other arrangements, fluid jets are directed at the workpiece to agitate the flow at the workpiece surface.

The foregoing arrangements suffer from several drawbacks. For example, the electrode may not apply or remove material from the workpiece in a spatially uniform manner, causing some areas of the workpiece to gain or lose material at a greater rate than others. Existing devices are also not configured to transfer material to and/or from different types of workpieces without requiring lengthy, unproductive time intervals between processing periods, during which the devices must be reconfigured (for example, by moving the electrodes and/or a shield to adjust the electric field within the electrolyte). Another drawback is that the paddles can disturb the uniformity of the electric field created by the electrode, which further affects the uniformity with which material is applied to or removed from the workpiece. Still another drawback with the foregoing arrangements is that the vessel may also include a magnet positioned proximate to the workpiece to control the orientation of material applied to the workpiece. When the electrode is removed from the vessel for servicing or replacement, it has been difficult to do so without interfering with and/or damaging the magnet.

SUMMARY

The present invention is a paddle reactor and method for providing enhanced mass transfer of an electrochemical solution to or from the surface of a microfeature workpiece, while at the same time providing control over the electric field at the surface of the workpiece. The reactor of the present invention includes a plurality of electrodes separated by dielectric barriers having gaps that form a corresponding plurality of virtual electrode locations to allow spatial control over the material deposition or removal process at the workpiece. The reactor of this invention also includes an electric field control element that controls the electrical current density in the processing fluid to have different values at different circumferential locations proximate to the workpiece.

A particularly useful embodiment of the reactor of this invention includes an array of elongated paddles positioned between a process location (where a workpiece would be positioned for electrochemical processing) and a plurality of electrodes that define a corresponding plurality of virtual electrode locations. One of the electrodes is a thieving electrode positioned apart from the process location to attract ions that would otherwise attach to the peripheral portion of the workpiece during a deposition process, thereby countering the tendency for this region to plate at a higher rate than other regions of the workpiece. The electric field control element includes openings, such as slots or apertures, that provide a greater open area in opposing circumferential locations than in intermediate circumferential locations. The intermediate locations are aligned with the motion direction of the elongated paddles to provide reduced current thieving at these locations, which counteracts an expected tendency for these locations to otherwise plate at a reduced rate.

The electrodes, including the thieving electrode, can be removed from the reactor by moving them away from, rather than toward, the process location. Accordingly, the electrodes may be removed without interfering with a magnet positioned at the process location to control the orientation of material applied to the workpiece.

DETAILED DESCRIPTION

As used herein, the terms "microfeature workpiece" and "workpiece" refer to substrates on and/or in which microelectronic devices or other microdevices are integrally formed. Typical microdevices include microelectronic circuits or components, thin-film recording heads, data storage elements, microfluidic devices, and other products. Micromachines or micromechanical devices are included within this definition because they are manufactured using much of the same technology that is used in the fabrication of integrated circuits. The substrates can be semiconductive pieces (e.g., doped silicon wafers or gallium arsenide wafers), nonconductive pieces (e.g., various ceramic substrates), or conductive pieces. In some cases, the workpieces are generally round and in other cases, the workpieces have other shapes, including rectilinear shapes.

Several examples of reactors in accordance with the invention are set forth in FIGS. 1-7 and the following text to provide a thorough understanding of particular embodiments of the invention. The description is divided into the following sections: (A) Embodiments of Tools and Reactors Having Multiple Electrodes and Enclosed Paddle Devices; and (B) Embodiments of Reactors Having Electric Field Control Elements to Circumferentially Vary an Electric Field. A person skilled in the art will understand, however, that the invention may have additional embodiments, and that the invention may be practiced without several of the details of the embodiments shown in FIGS. 1-7.

Figure 1:
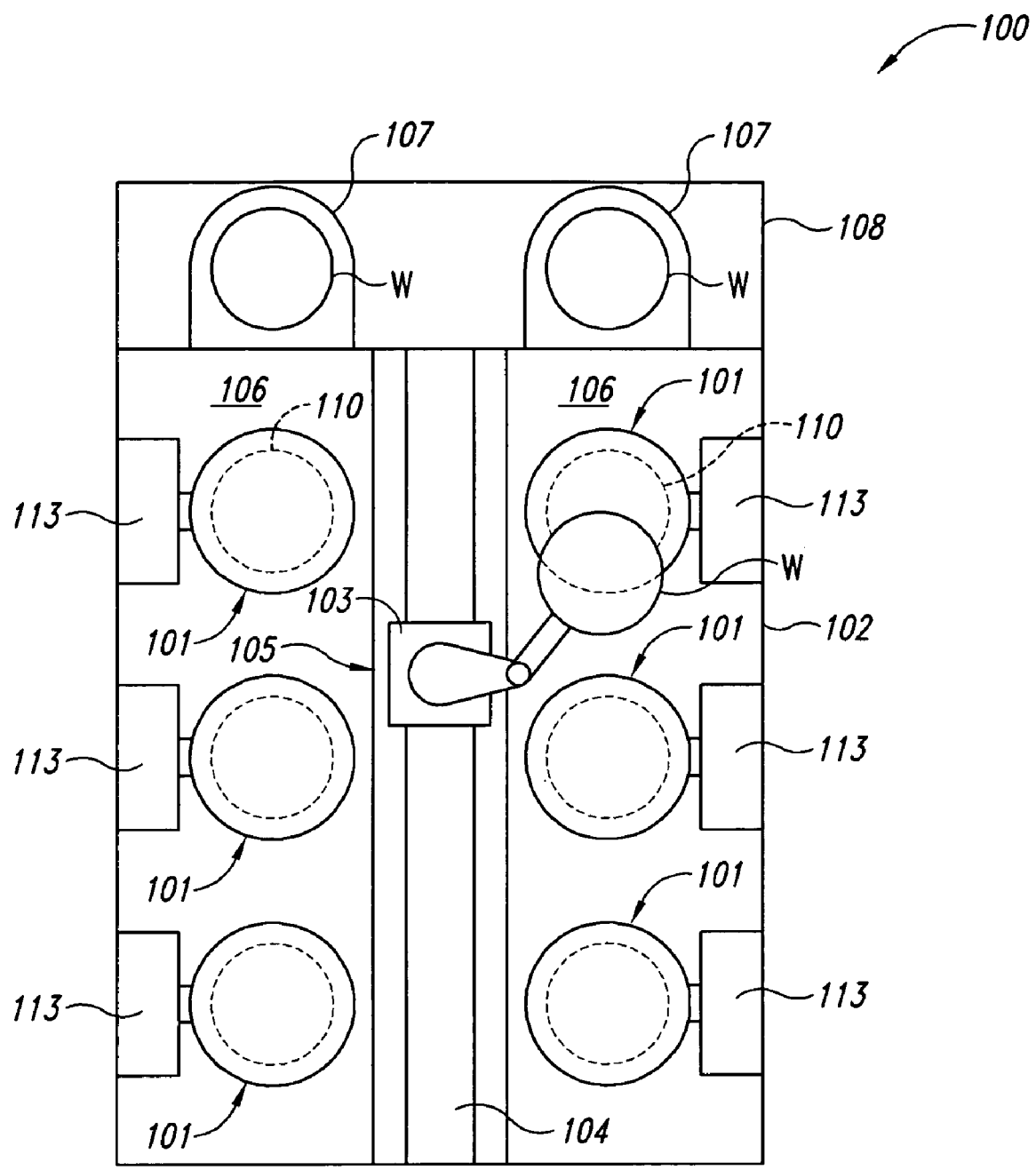
FIG. 1 is a schematic plan view of a tool having reactors configured in accordance with an embodiment of the invention.

A. Embodiments of Tools and Reactors Having Multiple Electrodes and Enclosed Paddle Devices FIG. 1 schematically illustrates an integrated tool 100 that can perform one or more wet chemical processes. The tool 100 includes a housing or a cabinet 102 that encloses a platform 106, a plurality of wet chemical processing stations 101, and a transport system 105. Each processing station 101 includes a vessel, chamber or reactor 110 and a workpiece support (for example, a lift-rotate unit) 113 for transferring microfeature workpieces W into and out of the reactor 110. The stations 101 can include rinse/dry chambers, cleaning capsules, etching capsules, electrochemical deposition chambers, or other types of wet chemical processing vessels. The transport system 105 includes a linear track 104 and a robot 103 that moves along the track 104 to transport individual workpieces W within the tool 100. The integrated tool 100 further includes a workpiece load/unload unit 108 having a plurality of containers 107 for holding the workpieces W. In operation, the robot 103 transports workpieces W to/from the containers 107 and the processing stations 101 according to a predetermined workflow schedule within the tool 100. Further details of an integrated tool 100 are provided in co-pending U.S. application Ser. No. 10/733,807, entitled "Integrated Microfeature Workpiece Processing Tools With Registration Systems for Paddle Reactors," incorporated herein in its entirety by reference and filed concurrently herewith.

Figure 2:
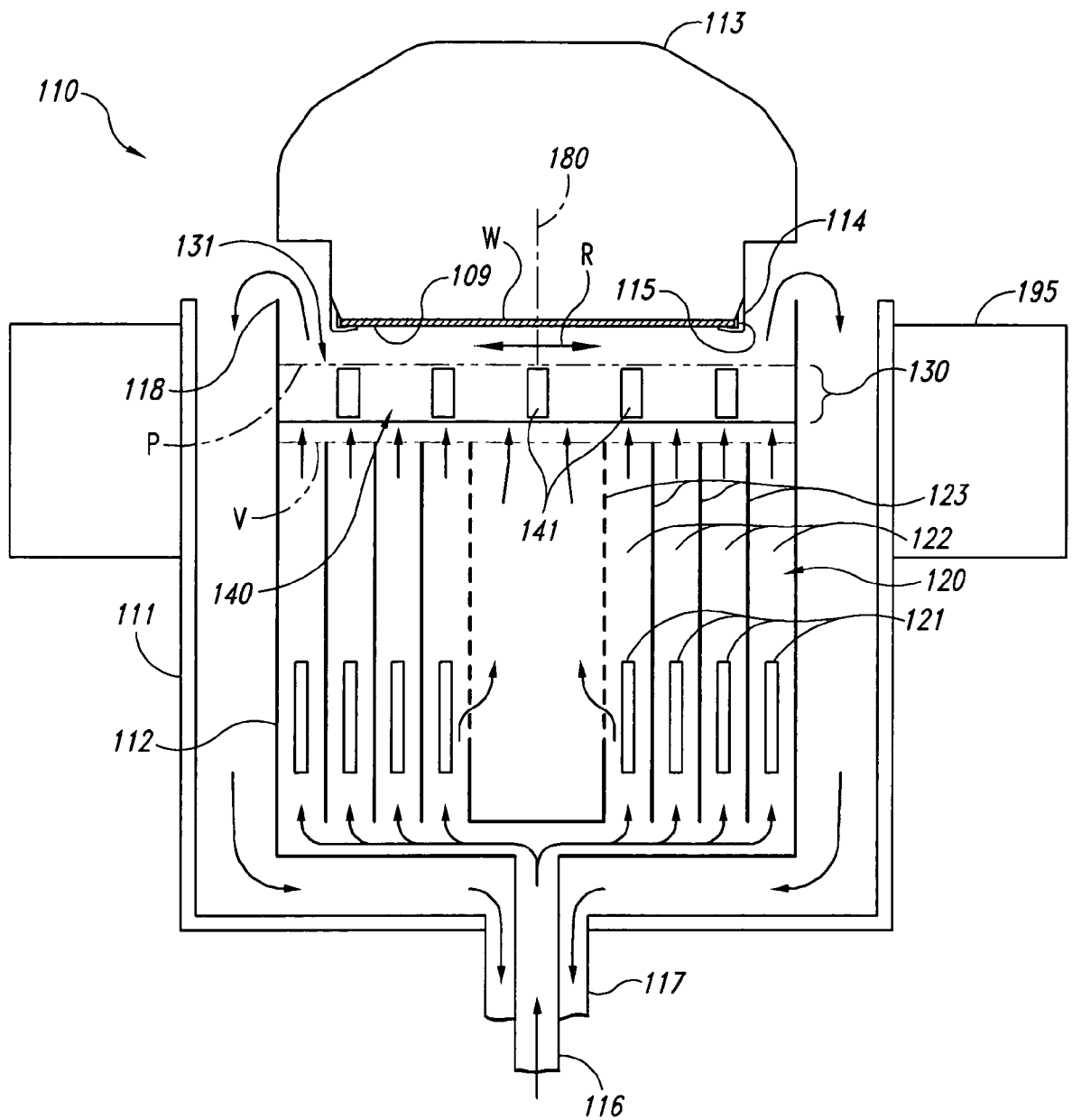
FIG. 2 is a schematic illustration of a reactor having paddles and electrodes configured in accordance with an embodiment of the invention.

FIG. 2 is a schematic illustration of a reactor 110 configured in accordance with an embodiment of the invention. The reactor 110 includes an inner vessel 112 positioned within an outer vessel 111. Processing fluid (e.g., an electrolyte) is supplied to the inner vessel 112 at an inlet 116 and flows upwardly over a weir 118 to the outer vessel 111. The processing fluid exits the reactor 110 at a drain 117. An electrode support 120 is positioned between the inlet 116 and the weir 118. The electrode support 120 includes a plurality of generally annular electrode compartments 122, separated by compartment walls 123. A corresponding plurality of annular electrodes 121 are positioned in the electrode compartments 122. The compartment walls 123 are formed from a dielectric material, and the gaps between the top edges of the compartment walls 123 define a composite virtual electrode location V. As used herein, the term "virtual anode location" or "virtual electrode location" refers to a plane spaced apart from the physical anodes or electrodes through which all the current flux for one or more of the electrodes or anodes passes.

A paddle chamber 130 is positioned proximate to the virtual electrode location V. The paddle chamber 130 includes a paddle device 140 having paddles 141 that reciprocate back and forth relative to a central position 180, as indicated by arrow R. The paddle chamber 130 also has an aperture 131 defining a process location P. A microfeature workpiece W is supported at the process location P by a workpiece support 113, so that a downwardly facing process surface 109 of the workpiece W is in contact with the processing fluid. The paddles 141 agitate the processing fluid at the process surface 109 of the workpiece W. At the same time, the relative value of the electrical potential (e.g., the polarity) applied to each of the electrodes 121, and/or the current flowing through each of the electrodes 121, may be selected to control a manner in which material is added to or removed from the workpiece W. Accordingly, the paddles 141 can enhance the mass transfer process at the process surface 109, while the electrodes 121 provide for a controlled electric field at the process surface 109. Alternatively, the electrodes 121 may be eliminated when the reactor 110 is used to perform processes (such as electroless deposition processes) that still benefit from enhanced mass transfer effects at the process surface 109.

The reactor 110 includes a generally horseshoe-shaped magnet 195 disposed around the outer vessel 111. The magnet 195 includes a permanent magnet and/or an electromagnet positioned to orient molecules of material applied to the workpiece W in a particular direction. For example, such an arrangement is used to apply permalloy and/or other magnetically directional materials to the workpiece W. In other embodiments, the magnet 195 may be eliminated.

The workpiece support 113, positioned above the magnet 195, rotates between a face up position (to load and unload the microfeature workpiece W) and a face down position (for processing). When the workpiece W is in the face down position, the workpiece support 113 descends to bring the workpiece W into contact with the processing fluid at the process location P. The workpiece support 113 can also spin the workpiece W about an axis generally normal to the downwardly facing process surface 109. The workpiece support 113 spins the workpiece W to a selected orientation prior to processing, for example, when the process is sensitive to the orientation of the workpiece W, including during deposition of magnetically responsive materials. The workpiece support 113 ascends after processing and then inverts to unload the workpiece W from the reactor 110. The workpiece support 113 may also spin the workpiece W during processing (e.g., during other types of material application and/or removal processes, and/or during rinsing), in addition to or in lieu of orienting the workpiece W prior to processing. Alternatively, the workpiece support 113 may not rotate at all, e.g., when spinning before, during or after processing is not beneficial to the performed process. The workpiece support 113 also includes a workpiece contact 115 (e.g., a ring contact) that supplies electrical current to the front surface or back surface of the workpiece W. A seal 114 extends around the workpiece contact 115 to protect it from exposure to the processing fluid. In another arrangement, the seal 114 can be eliminated.

Figure 3:
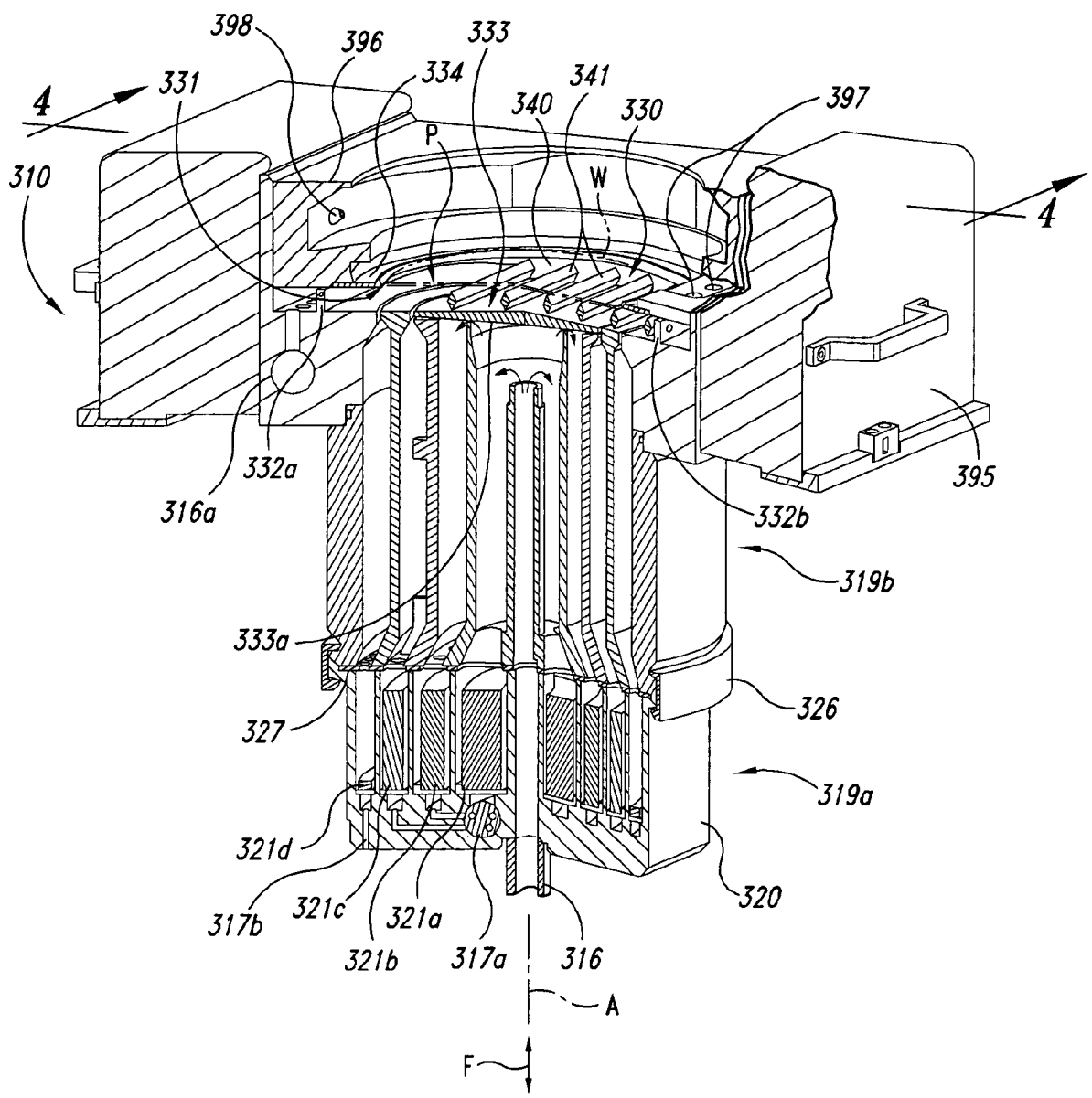
FIG. 3 is a partially cutaway, isometric illustration of a reactor having electrodes and a magnet positioned relative to a paddle chamber in accordance with another embodiment of the invention.

FIG. 3 is a partially schematic, cutaway illustration of a reactor 310 configured in accordance with an embodiment of the invention. The reactor 310 includes a lower portion 319a, an upper portion 319b above the lower portion 319a, and a paddle chamber 330 above the upper portion 319b. The lower portion 319a houses an electrode support or pack 320 which in turn houses a plurality of annular electrodes 321 (shown in FIG. 3 as electrodes 321a-321d). The lower portion 319a is coupled to the upper portion 319b with a clamp 326. A perforated gasket 327 positioned between the lower portion 319a and the upper portion 319b allows fluid and electrical communication between these two portions. The rinse fluid is provided by one or more nozzles 398. In one embodiment, the nozzle 398 projects from the wall of the upper ring portion 396. In other embodiments, the nozzle or nozzles 398 are flush with or recessed from the wall. In any of these arrangements, the nozzle or nozzles 398 are positioned to direct a stream of fluid (e.g., a rinse fluid) toward the workpiece W when the workpiece W is raised above the process location P and, optionally, while the workpiece W spins. Accordingly, the nozzle(s) 398 provide an in-situ rinse capability, to quickly rinse processing fluid from the workpiece W after a selected processing time has elapsed. This reduces inadvertent processing after the elapsed time, which might occur if chemically active fluids remain in contact with the workpiece W for even a relatively short post-processing time prior to rinsing.

The paddle chamber 330 includes a base 333, and a top 334 having an aperture 331 at the process location P. The paddle chamber 330 houses a paddle device 340 having multiple paddles 341 that reciprocate back and forth beneath the workpiece W (shown in phantom lines in FIG. 3) at the process location P. A magnet 395 is positioned adjacent to the process location P to control the orientation of magnetically sensitive materials deposited on the workpiece W by the processing fluid. An upper ring portion 396 positioned above the process location P collects exhaust gases during electrochemical processing, and collects rinse fluid during rinsing.

Processing fluid enters the reactor 310 through an inlet 316. Fluid proceeding through the inlet 316 fills the lower portion 319a and the upper portion 319b, and can enter the paddle chamber 330 through a permeable portion 333a of the base 333, and through gaps in the base 333. Some of the processing fluid exits the reactor 310 through first and second return flow collectors 317a, 317b. Additional processing fluid enters the paddle chamber 330 directly from an entrance port 316a and proceeds through a gap in a first wall 332a, laterally across the paddle chamber 330 to a gap in a second wall 332b. At least some of the processing fluid within the paddle chamber 330 rises above the process location P and exits through drain ports 397. Further details of the flow into and through the paddle chamber 330, and further details of the paddle device 340 are included in pending U.S. patent application Ser. No. 10/734,098, entitled "Paddles and Enclosures for Enhancing Mass Transfer During Processing of Microfeature Workpieces," incorporated herein in its entirety by reference and filed concurrently herewith.

One feature of the arrangement shown in FIG. 3 is that the lower portion 319a (which houses the electrode support 320) is coupled to and decoupled from the upper portion 319b by moving the electrode support 320 along an installation/removal axis A, as indicated by arrow F. Accordingly, the electrode support 320 need not pass through the open center of the magnet 395 during installation and removal. An advantage of this feature is that the electrode support 320 (which may include a magnetically responsive material, such as a ferromagnetic material) will be less likely to be drawn toward the magnet 395 during installation and/or removal. This feature can make installation of the electrode support 320 substantially simpler and can reduce the likelihood for damage to either the electrode support 320 or other portions of the reactor 310 (including the magnet 395). Such damage can result from collisions caused by the attractive forces between the magnet 395 and the electrode support 320.

Figure 4:
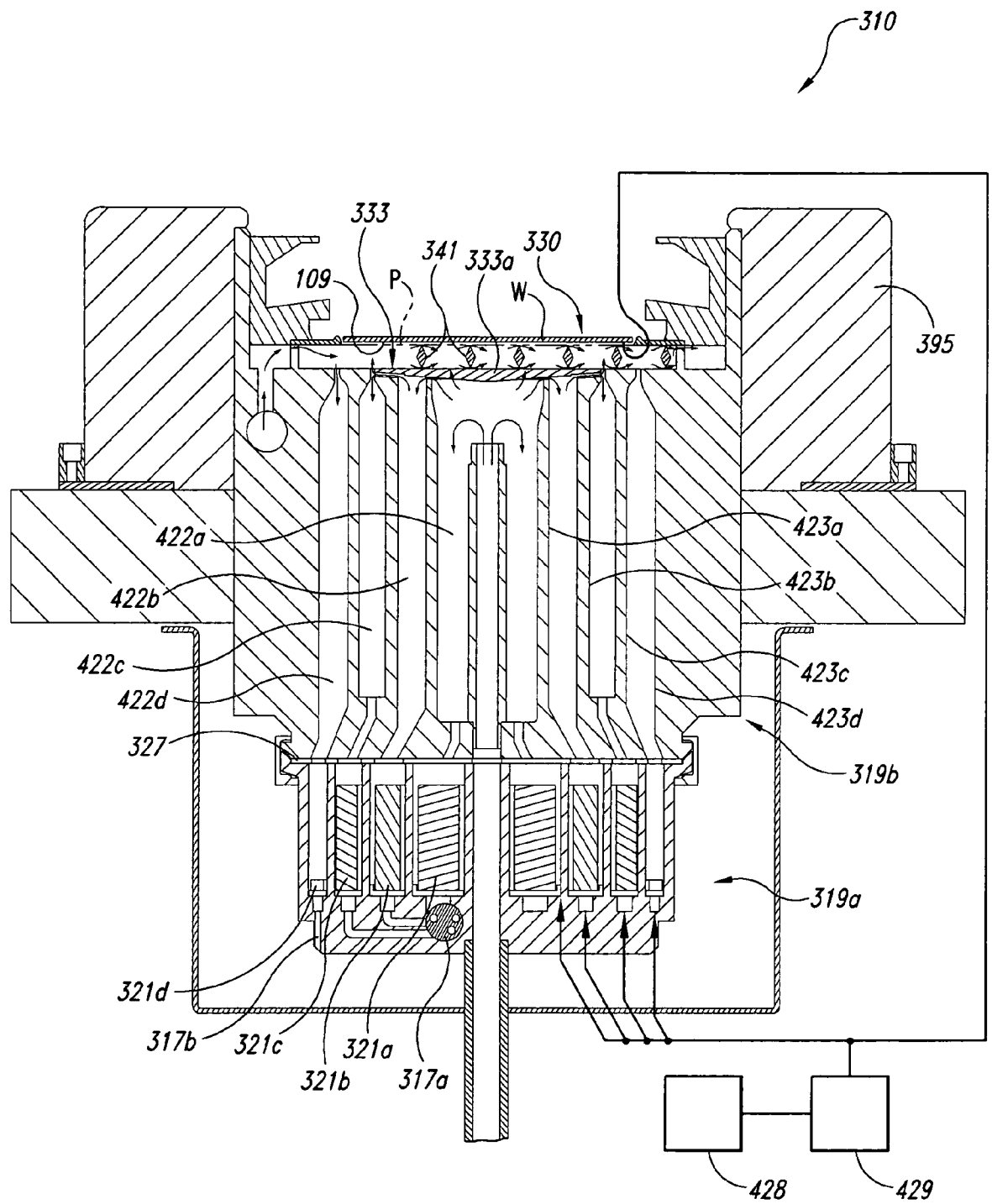
FIG. 4 is a partially schematic, cross-sectional view of the reactor shown in FIG. 3.

FIG. 4 is a cross-sectional side elevation view of an embodiment of the reactor 310, taken substantially along line 4-4 of FIG. 3. The lower and upper portions 319a, 319b include multiple compartment walls 423 (four are shown in FIG. 4 as compartment walls 423a-423d) that divide the volume within these portions into a corresponding plurality of annular compartments 422 (four are shown in FIG. 4 as compartments 422a-422d), each of which houses one of the electrodes 321. The gaps between adjacent compartment walls 423 (e.g., at the tops of the compartment walls 423) provide for "virtual electrodes" at these locations. The permeable base portion 333a can also provide a virtual electrode location.

The electrodes 321a-321d are coupled to a power supply 428 and a controller 429. The power supply 428 and the controller 429 together control the electrical potential and current applied to each of the electrodes 321a-321d, and the workpiece W. Accordingly, an operator can control the rate at which material is applied to and/or removed from the workpiece W in a spatially and/or temporally varying manner. In particular, the operator can select the outermost electrode 321d to operate as a current thief. Accordingly, during a deposition process, the outermost electrode 321d attracts ions that would otherwise be attracted to the workpiece W. This can counteract the terminal effect, e.g., the tendency for the workpiece W to plate more rapidly at its periphery than at its center when the workpiece contact 115 (FIG. 2) contacts the periphery of the workpiece W. Alternatively, the operator can temporally and/or spatially control the current distribution across the workpiece W to produce a desired thickness distribution of applied material (e.g., flat, edge thick, or edge thin).

One advantage of the foregoing arrangement is that the multiple electrodes provide the operator with increased control over the rate and manner with which material is applied to or removed from the workpiece W. Another advantage is that the operator can account for differences between consecutively processed workpieces or workpiece batches by adjusting the current and/or electric potential applied to each electrode, rather than physically adjusting parameters of the reactor 310. Further details of multiple electrode arrangements and arrangements for controlling the electrodes are included in the following pending U.S. applications: Ser. No. 09/804,697 entitled "System for Electrochemically Processing a Workpiece," filed Mar. 12, 2001; 60/476,881 entitled "Electrochemical Deposition Chambers for Depositing Materials Onto Microfeature Workpieces," filed Jun. 6, 2003; Ser. No. 10/158,220, entitled "Methods and Systems for Controlling Current in Electrochemical Processing of Microelectronic Workpieces," filed May 29, 2002; and Ser. No. 10/426,029, entitled, "Method and Apparatus for Controlling Vessel Characteristics, Including Shape and Thieving Current for Processing Microelectronic Workpieces," filed Apr. 28, 2003, all incorporated herein in their entireties by reference.

When the outermost electrode 321d operates as a current thief, it is desirable to maintain electrical isolation between the outermost electrode 321d on the one hand and the innermost electrodes 321a-321c on the other. Accordingly, the reactor 310 includes a first return flow collector 317a and a second return flow collector 317b. The first return flow collector 317a collects flow from the innermost three electrode compartments 422a-422c, and the second return flow collector 317b collects processing fluid from the outermost electrode compartment 422d to maintain electrical isolation for the outermost electrode 321d. By draining the processing fluid downwardly toward the electrodes 321, this arrangement can also reduce the likelihood for particulates (e.g., flakes from consumable electrodes) to enter the paddle chamber 330. By positioning the outermost electrode 321d remotely from the process location P, it can be easily removed and installed without disturbing structures adjacent to the process location P. This is unlike some existing arrangements having current thiefs positioned directly adjacent to the process location.

One feature of an embodiment of the reactor 310 described above with reference to FIGS. 3 and 4 is that the electrodes 321 are positioned remotely from the process location P. An advantage of this feature is that the desired distribution of current density at the process surface 109 of the workpiece W can be maintained even when the electrodes 321 change shape. For example, when the electrodes 321 include consumable electrodes and change shape during plating processes, the increased distance between the electrodes 321 and the process location P reduces the effect of the shape change on the current density at the process surface 109, when compared with the effect of electrodes positioned close to the process location P. Another advantage is that shadowing effects introduced by features in the flow path between the electrodes 321 and the workpiece W (for example, the gasket 327) can be reduced due to the increased spacing between the electrodes 321 and the process location P.

In other arrangements, the electrodes 321 have other locations and/or configurations. For example, in one arrangement, the chamber base 333 houses one or more of the electrodes 321. Accordingly, the chamber base 333 may include a plurality of concentric, annular, porous electrodes (formed, for example, from sintered metal) to provide for (a) spatially and/or temporally controllable electrical fields at the process location P, and (b) a flow path into the paddle chamber 330. Alternatively, the paddles 341 themselves may be coupled to an electrical potential to function as electrodes, in particular, when formed from a non-consumable material. In still other arrangements, the reactor 310 may include more or fewer than four electrodes, and/or the electrodes may be positioned more remotely from the process location P, and may maintain fluid and electrical communication with the process location P via conduits.

Figure 5:
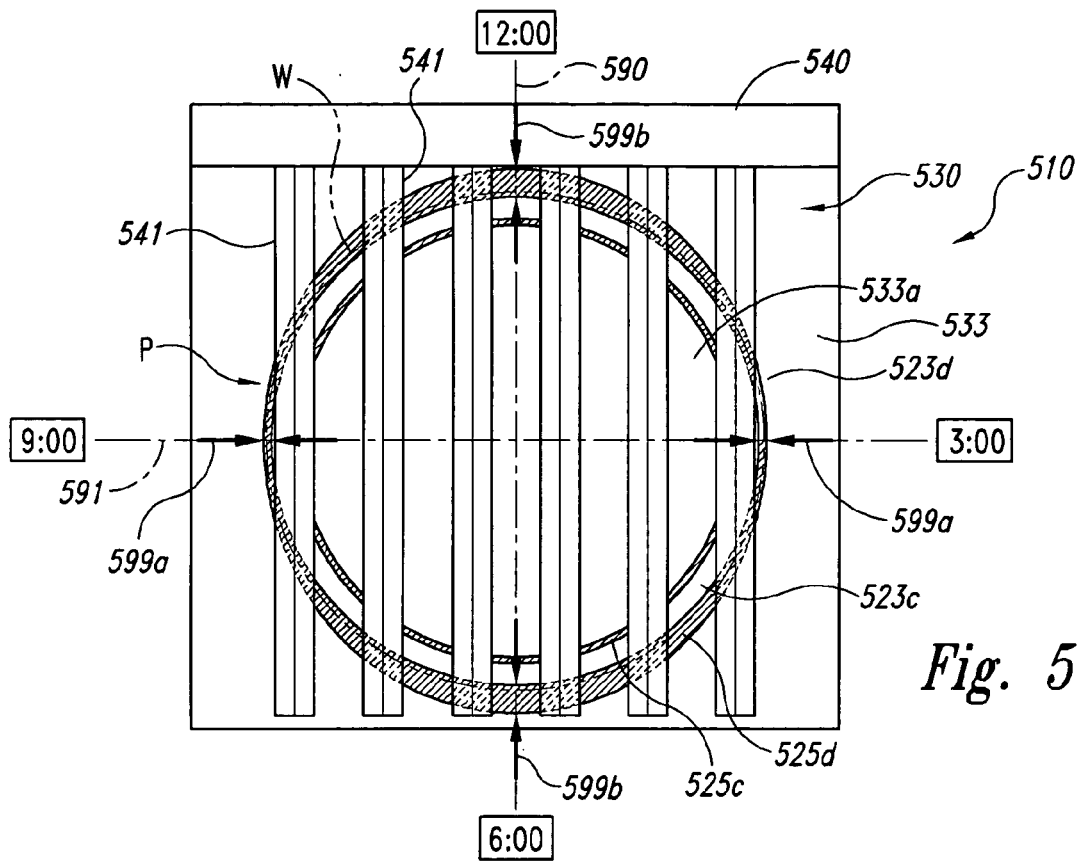
FIG. 5 is a schematic illustration of an electric field control element configured to circumferentially vary the effect of an electrode in accordance with an embodiment of the invention.

B. Embodiments of Reactors Having Electric Field Control Elements to Circumferentially Vary an Electric Field FIG. 5 is a partially schematic illustration looking downwardly on a reactor 510 having a paddle device 540 positioned in a paddle chamber 530 in accordance with an embodiment of the invention. The paddle chamber 530 and the paddle device 540 are arranged generally similarly to the paddle chambers and the paddle devices described above with reference to FIGS. 2-4. Accordingly, the paddle device 540 includes a plurality of paddles 541 elongated parallel to a paddle axis 590 and movable relative to a workpiece W (shown in phantom lines in FIG. 5) along a paddle motion axis 591.

The elongated paddles 541 can potentially affect the uniformity of the electric field proximate to the circular workpiece W in a circumferentially varying manner. Accordingly, the reactor 510 includes features for circumferentially varying the effect of the thieving electrode (not visible in FIG. 5) to account for this potential circumferential variation in current distribution.

The paddle chamber 530 shown in FIG. 5 includes a base 533 formed by a permeable base portion 533a and by the upper edges of walls 523 that separate the electrode chambers below (a third wall 523c and a fourth or outer wall 523d are visible in FIG. 5). The third wall 523c is spaced apart from the permeable base portion 533a by a third wall gap 525c, and the fourth wall 523d is spaced apart from the third wall 523c by a circumferentially varying fourth wall gap 525d. Both gaps 525c and 525d are shaded for purposes of illustration. The shaded openings also represent the virtual anode locations for the outermost two electrodes, in one aspect of this embodiment.

The fourth wall gap 525d has narrow portions 599a proximate to the 3:00 and 9:00 positions shown in FIG. 5, and wide portions 599b proximate to the 12:00 and 6:00 positions shown in FIG. 5. For purposes of illustration, the disparities between the narrow portions 599a and the wide portions 599b are exaggerated in FIG. 5. In a particular example, the narrow portions 599a have a width of about 0.16 inches, and the wide portions 599b have a width of from about 0.18 inches to about 0.22 inches. The narrow portions 599a and the wide portions 599b create a circumferentially varying distribution of the thief current (provided by a current thief located below the fourth wall gap 525d) that is stronger at the 12:00 and 6:00 positions than at the 3:00 and 9:00 positions. In particular, the thief current can have different values at different circumferential locations that are approximately the same radial distance from the center of the process location P and/or the workpiece W. Alternatively, a circumferentially varying fourth wall gap 525d or a circumferentially varying third wall gap 525c or other gap can be used to deliberately create a three dimensional effect, for example on a workpiece W that has circumferentially varying plating or deplating requirements. One example of such a workpiece W includes a patterned wafer having an open area (e.g., accessible for plating) that varies in a circumferential manner. In further embodiments the gap width or other characteristics of the reactor 510 can be tailored to account for the conductivity of the electrolyte in the reactor 510.

Figure 6:
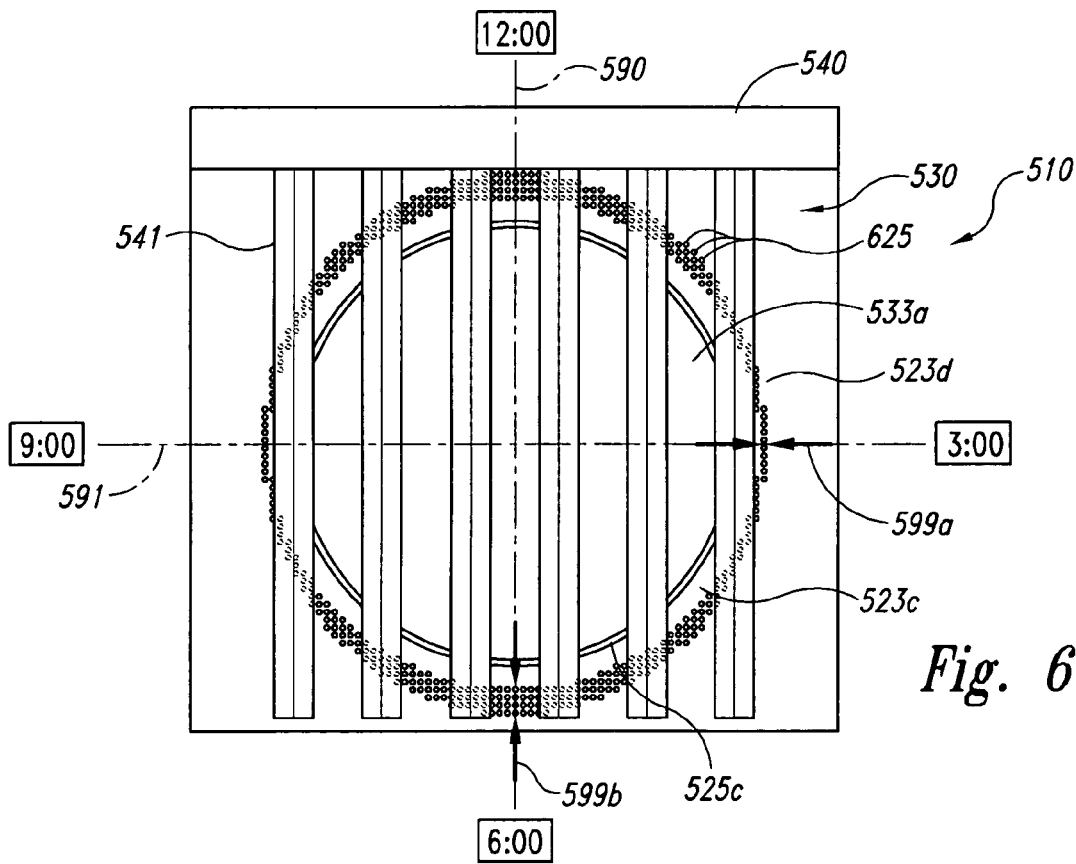
FIG. 6 is a partially schematic illustration of another embodiment of an electric field control element.

FIG. 6 illustrates an arrangement in which the region between the third wall 523c and the fourth wall 523d is occupied by a plurality of holes 625 rather than a gap. The spacing and/or size of the holes 625 varies in a circumferential manner so that a current thief positioned below the holes 625 has a stronger effect proximate to the 12:00 and 6:00 positions then proximate to the 3:00 and 9:00 positions.

Figure 7:
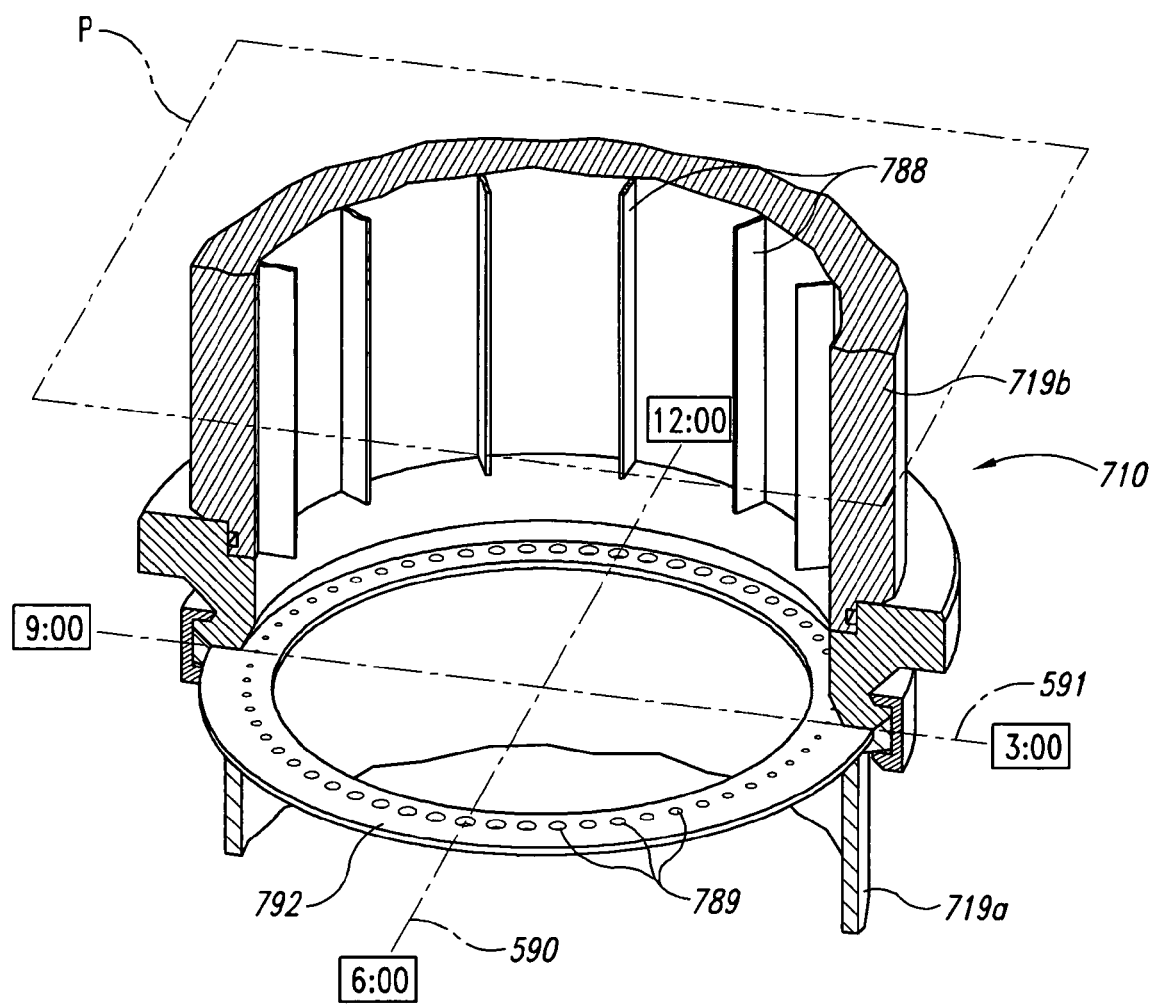
FIG. 7 is a partially schematic, isometric illustration of an electric field control element that also functions as a gasket in accordance with an embodiment of the invention.

FIG. 7 is a partially cut-away, isometric view of a portion of a reactor 710 having an electric field control element 792 that is not part of the paddle chamber. The reactor 710 includes an upper portion 719b that replaces the upper portion 319b shown in FIG. 3. The electric field control element 792 is positioned at the lower end of the upper portion 719b and has openings 789 arranged to provide a circumferentially varying open area. The openings 789 are larger at the 12:00 and 6:00 positions than they are at the 3:00 and 9:00 positions. Alternatively, the relative number of openings 789 (instead of or in addition to the size of openings 789) may be greater at the 12:00 and 6:00 positions in a manner generally similar to that described above with reference to FIG. 6. The upper portion 719b also includes upwardly extending vanes 788 that maintain the circumferentially varying electrical characteristics caused by the electric field control element 792, in a direction extending upwardly to the process location P. The reactor 710 may include twelve vertically extending vanes 788, or other numbers of vanes 788, depending, for example, on the degree to which the open area varies in the circumferential direction.

The electric field control element 792 also functions as a gasket between the upper portion 719b and a lower portion 719a of the reactor 710, and can replace the gasket 327 described above with reference to FIG. 3 to achieve the desired circumferential electric field variation. Alternatively, the electric field control element 792 may be provided in addition to the gasket 327, for example, at a position below the gasket 327 shown in FIG. 3. In either case, an operator can select and install an electric field control element 792 having open areas configured for a specific workpiece (or batch of workpieces), without disturbing the upper portion 719b of the reactor 710. An advantage of this arrangement is that it reduces the time required by the operator to service the reactor 710 and/or tailor the electric field characteristics of the reactor 710 to a particular type of workpiece W.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A system for processing microfeature workpieces, comprising:
    a vessel configured to receive a processing fluid, the vessel having a process location positioned to receive a microfeature workpiece, the process location having a center;
    an electrode support positioned to carry at least one electrode in fluid communication with the process location;
    a workpiece support positioned to carry a microfeature workpiece at the process location of the vessel; and
    an electric field control element positioned along a flow path between the electrode support and the process location, the electric field control element being configured to control an electrical current density in the processing fluid at the process location to have a first value at a first circumferential site of the process location and a second value different than the first value at a second circumferential site of the process location, the first and second circumferential sites being approximately the same distance from the center of the process location, wherein the vessel includes vanes aligned along axes extending between the electric field control element and the process location.

2. A system for processing microfeature workpieces, comprising:
    a vessel configured to receive a processing fluid, the vessel having a process location positioned to receive a microfeature workpiece, the process location having a center;
    an electrode support positioned to carry at least one electrode in fluid communication with the process location;
    a workpiece support positioned to carry a microfeature workpiece at the process location of the vessel;
    a paddle device having at least one paddle elongated along a paddle axis and movable relative to the process location along a motion axis transverse to the paddle axis; and
    an electric field control element positioned along a flow path between the electrode support and the process location, the electric field control element being configured to control an electrical current density in the processing fluid at the process location to have a first value at a first circumferential site of the process location generally aligned with the motion axis, and a second value less than the first value at a second circumferential site of the process location generally aligned with the paddle axis, the first and second circumferential sites being approximately the same distance from the center of the process location, wherein the vessel includes vanes aligned along axes extending between the electric field control element and the process location.

3. The system of claim 2 wherein:
    the workpiece support is positioned to carry the microfeature workpiece face-down in a generally horizontal orientation at the process location of the vessel during processing, the workpiece support being movable relative to the vessel between a load/unload position and a process position;
    the paddle device is positioned below the workpiece support and has at least one paddle, and wherein at least one of the workpiece support and the at least one paddle is movable relative to the other along a linear motion path while the workpiece support carries a microfeature workpiece; and
    the electrode support carries a thieving electrode in fluid communication with the process location, the thieving electrode being positioned along a flow path that includes a virtual thief location spaced apart from the process plane.

4. The system of claim 3, further comprising:
    a contact electrode carried by the workpiece support and positioned to make electrical contact with a microfeature workpiece when the workpiece support carries the microfeature workpiece;
    at least one anode spaced apart from the process location; and
    one or more power supplies coupled among the contact electrode, the thieving electrode and the at least one anode to provide current to the at least one anode at a potential greater than potentials provided to the thieving electrode and the contact electrode.

5. The system of claim 2 wherein the electrode support includes a plurality of electrode chambers at least partially separated from each other by dielectric barriers, gaps between the dielectric barriers forming a corresponding plurality of virtual electrode locations spaced apart from the process location.

6. The system of claim 5, further comprising a plurality of electrodes disposed in the corresponding plurality of electrode chambers.

7. The system of claim 2, further comprising an at least partially enclosed paddle chamber positioned between the electrode support and the process location, the paddle chamber housing the at least one paddle.

8. The system of claim 2 wherein the processing fluid is a first processing fluid, and wherein the system further comprises:
a nozzle coupleable to a source of a second processing fluid and positioned above the process location to direct a stream of the second processing fluid toward a microfeature workpiece carried by the workpiece support.

9. The system of claim 8 wherein the workpiece support is movable between a first position to carry a microfeature workpiece in contact with the first processing fluid at the process location, and a second position above the first position to place the microfeature workpiece in a path of the stream of second processing fluid directed by the nozzle.

10. The system of claim 8 wherein the electrode support has a plurality of electrode chambers at least partially separated from each other by barriers, gaps between the barriers forming a corresponding plurality of virtual electrode locations spaced apart from the process location.

11. The system of claim 8, further comprising an at least partially enclosed paddle chamber positioned between the electrode support and the process location, the paddle chamber housing the at least one paddle.

12. The system of claim 2, further comprising an electrode thief spaced apart from the process location, the electrode thief being positioned in fluid communication with the process location to receive ions from the processing fluid that would otherwise attach to the microfeature workpiece.

13. The system of claim 2, further comprising:
a magnet positioned to impose a magnetic field at the process location to orient material deposited on a microfeature workpiece; and wherein
the electrode support is movable relative to the vessel between a process position and a removed position along a motion path that does not pass through the process plane.

14. The system of claim 13 wherein the magnet includes a permanent magnet.

15. The system of claim 2 wherein the electric field control element includes a slot having a first region with a first width and a second region with a second width greater than the first width.

16. The system of claim 2 wherein the electric field control element includes a plurality of apertures, with apertures in a first region of the electric field control element providing a first open area and apertures in a second region of the electric field control element providing a second open area greater than the first open area.

17. The system of claim 2 wherein the vessel includes a first portion and a second portion sealably coupled to the first portion, and wherein the electric field control element includes a gasket sealably positioned between the first and second portions.

18. The system of claim 2, further comprising:
a paddle chamber in fluid communication with the vessel, the paddle chamber having an opening at the process location to receive a microfeature workpiece, and wherein the electric field control element forms a portion of the paddle chamber facing toward the opening, and wherein the paddle device is disposed in the paddle chamber.

19. The system of claim 2 wherein the electric field control element has a first flow-through area in regions aligned with the paddle axis and a second flow-through area greater than the first in regions aligned with the motion axis.

20. The system of claim 2 wherein:
the workpiece support is positioned to carry the microfeature workpiece face-down in a generally horizontal orientation at the process location of the vessel, and to rotate the microfeature workpiece relative to the vessel, the workpiece support being movable relative to the vessel between a load/unload position and a process position.

21. The system of claim 2 wherein the at least one paddle includes a plurality of paddles having spaced apart paddle surfaces.

22. The system of claim 2 further comprising a magnet positioned at least proximate to the process location to orient magnetically sensitive material as it is deposited on the microfeature workpiece, and wherein the workpiece support is rotatable to orient the microfeature workpiece relative to the magnet for receiving the magnetically sensitive material.

* * * * *